United States Patent [19]

Fukumoto et al.

[11] Patent Number: 4,742,506
[45] Date of Patent: May 3, 1988

[54] TRACKING ERROR DETECTING APPARATUS FOR AN OPTICAL HEAD WITH SKEW ERROR REDUCTION BY USING AN INCLINED HEADER PORTION

[75] Inventors: Atsushi Fukumoto, Tokyo; Kiyoshi Ohsato; Yasunori Terayama, both of Chiba, all of Japan

[73] Assignee: Sony Corporation, Tokyo, Japan

[21] Appl. No.: 753,570

[22] Filed: Jul. 10, 1985

[30] Foreign Application Priority Data

| Jul. 12, 1984 | [JP] | Japan | 59-144927 |
| Jul. 13, 1984 | [JP] | Japan | 59-145766 |
| Apr. 30, 1985 | [JP] | Japan | 60-92814 |
| Apr. 30, 1985 | [JP] | Japan | 60-92815 |

[51] Int. Cl.$^4$ .................. G11B 7/095; G11B 7/125
[52] U.S. Cl. ........................ 369/46; 369/121; 369/112; 369/120
[58] Field of Search ................... 369/44–46, 369/54, 121–122, 112, 120; 350/163–166; 332/7.51

[56] References Cited

U.S. PATENT DOCUMENTS

| 3,700,309 | 10/1972 | Skolnick et al. | 350/163 |
| 4,135,206 | 1/1979 | Kleuters et al. | 369/44 X |
| 4,356,392 | 10/1982 | Wittekoek et al. | 369/44 X |
| 4,374,324 | 2/1983 | VanRosmalen et al. | 369/44 X |
| 4,387,960 | 6/1983 | Tani | 350/164 |
| 4,422,721 | 12/1983 | Hahn et al. | 350/164 |
| 4,519,708 | 5/1985 | Perlmutter et al. | 350/164 X |
| 4,547,872 | 10/1985 | Henmi et al. | 369/121 X |
| 4,581,728 | 4/1986 | Nakamura et al. | 369/44 X |
| 4,589,103 | 5/1986 | Tajima | 369/46 |
| 4,592,038 | 5/1986 | Kubota et al. | 369/121 X |

FOREIGN PATENT DOCUMENTS 57-179954 11/1982 Japan ........................ 369/54

Primary Examiner—Raymond F. Cardillo
Assistant Examiner—Wayne R. Young
Attorney, Agent, or Firm—Lewis H. Eslinger

[57] ABSTRACT

There is disclosed a tracking error detecting apparatus for an optical head, which includes a semiconductor laser apparatus, a diffraction grating, a beam splitter, an objective lens and a photo-detector, in which a laser beam from the semiconductor laser apparatus is divided into a main beam and two side beams at both sides of the main beam by the diffraction grating, the three beams are introduced through the beam splitter and the objective lens to an optical recording medium, beams reflected on the optical recording medium are introduced through the objective lens to the beam splitter and reflected thereon, the reflected beams are made incident on the photo-detector and detected outputs of at least two beams of the three beams from the photo-detector are used to produce a tracking error signal corresponding to the tacking state of the main beam on the optical recording medium. In this case, the reflection of the side beam of the reflected beams on the optical recording medium which passes through the objective lens, the beam splitter and the diffraction grating and returns to the semiconductor laser apparatus is redirected at a laser beam emission header portion to thereby reduce the influence by the skew of the optical disc on the tracking error signal.

1 Claim, 4 Drawing Sheets

TRACKING ERROR DETECTING APPARATUS FOR AN OPTICAL HEAD WITH SKEW ERROR REDUCTION BY USING AN INCLINED HEADER PORTION

BACKGROUND OF THE INVENTION

1. Field of the Invention

This invention relates generally to tracking error detecting apparatus for an optical head and more particularly, is directed to a tracking error detecting apparatus for an optical head for use with an optical recording apparatus, an optical reproducing apparatus, an optical recording and/or reproducing apparatus.

2. Description of the Prior Art

FIG. 1 is a diagram showing an example of a prior art tracking error detecting apparatus for an optical head, in which reference letter OH generally designates an optical head on the whole. In FIG. 1, reference numeral 1 designates a semiconductor laser apparatus using a laser diode. In this semiconductor laser apparatus 1, a divergent laser beam L of ellipse-shape in cross section oscillated out or emitted from a laser light emission end face 1A thereof is made incident on a collimator lens 2 (which may be omitted as required) in which it is collimated as a parallel beam. This parallel beam is then made incident on a diffraction grating 3. From the diffraction grating 3 there are produced a zero-order beam $L_0$ and ± first-order beams $L_{+1}$ and $L_{-1}$ (beams higher than + second-order or lower than − second-order are neglected). These beams are traveled through a non-polarizing beam splitter (half mirror) 4 (if a polarizing beam splitter is used, a ¼ wavelength plate is provided between it and an objective lens 5) and is then made incident on the objective lens 5 thereby converged. The converged zero-order beam $L_0$ and ± first-order beams $L_{+1}$ and $L_{-1}$ are made incident on a recording surface of an optical disc 6 used as an optical recording medium (including a magnetooptical recording medium) with a predetermined spacing (for example, 10 μm) therebetween.

The zero-order beam $L_0$ and ± first-order beams $L_{+1}$ and $L_{-1}$ reflected by the optical recording disc 6 are traveled through the objective lens 5 and introduced into the beam splitter 4, while a part of them is reflected on a reflecting surface 4a of the beam splitter 4 and thereby made incident on a photo-detector 7. The photo-detector 7 is formed of three photo-detecting sections to permit the zero-order beam $L_0$ and ± first-order beams $L_{+1}$ and $L_{-1}$ to become incident thereon separately.

In the case of a tracking error detecting method known as a so-called three spots method, by calculating a difference between a pair of photo-detected outputs from a pair of photo-detecting sections on which the ± first-order beams $L_{+1}$ and $L_{-1}$ are incident, it is possible to obtain a tracking error signal which is corresponding to the tracking state of the zero-order beam $L_0$ on the recording surface of the optical disc 6. From the photo-detecting section on which the zero-order beam $L_0$ is made incident, there are produced a reproduced signal, a focusing error signal and so on.

Further, there is a method (see Japanese patent application No. 215860/1984) which is the improvement of a tracking error signal detecting method based on a so-called push-pull method. In this known method, of three beams, zero-order beam and one of the side beams provided at the both sides of the zero-order beam or all of three beams are used.

More specifically, this method uses such a photo-detector for the three beams the photo-detecting section of which is divided into equal two sections. Further, it is arranged such that when the beam spot by the zero-order beam lies on the track of the optical disc, the beam spots by the side beams provided at both sides of the zero-order beam lie on the lands or they are formed with a displacement of ½ track pitch. Accordingly, the outputs based on the difference between the detected outputs from the respective photo-detecting sections of the photo-detector relative to the beam spots, or the push-pull outputs become opposite in phase with respect to the beam spots formed by the zero-order beam and ± first-order beams. Whereas, the D.C. fluctuation components produced in the push-pull outputs by the lateral displacement of the objective lens and the skew of the disc become same in phase.

Accordingly, if a difference between the push-pull output $PP_0$ from the photo-detector relative to the zero-order beam and the push-pull output $PP_1$ or $PP_2$ from the photo-detector for + first-order beam or − first-order beam is calculated, regardless of the lateral displacement of the objective lens and the skew of the optical disc, it is possible to obtain a tracking error signal which has no D.C. fluctuation components.

Using three push-pull outputs, $PP_0$, $PP_1$ and $PP_2$, it is also possible to obtain the tracking error signal by caluculating $PP_0 - (G_1 PP_1 + G_2 PP_2)$. In this case, $G_1$ and $G_2$ represent constants which are presented by considering a difference between the gains of the photo-detectors.

Next, an example of the semiconductor laser apparatus 1 will be described with reference to FIG. 2.

Referring to FIG. 2, this semiconductor laser apparatus 1 is generally fixed to a header portion 8 made of metal such as copper and so on serving as one electrode which becomes a heat sink. In other words, in this example, the header portion 8 is formed of only the heat sink.

The structure of the laser chip of the semiconductor laser apparatus 1 will be described in the order of the upper layer to the lower layer. Reference numeral 1a designates an electrode layer, 1b an n-GaAs layer (substrate layer), 1c an n-Ga$_{1-y}$Al$_y$As layer (cladding layer), 1d a Ga$_{1-x}$Al$_x$As layer (cladding layer) and 1f a p-GaAs layer. The above laser beam L is oscillated out from the active layer 1d. If the laser beam emission end face (wall surface) 1A of this semiconductor laser apparatus 1 is taken as a front, the width thereof is in a range from 100 to 300 μm, the height (thickness) thereof is in a range from 80 to 100 μm and the depth thereof is in a range from 200 to 300 μm, respectively. The height of the active layer 1d from the upper surface of the header portion 8 is several μm.

By the way, in practice, when the tracking error detecting method of not only the three spots method but also improved push-pull system is used, if in the optical disc, there is the skew in the tangential direction thereof, a D.C. fluctuation is produced in the tracking error signal so that it is not possible to detect the tracking error precisely.

After various researches, the present inventors et al. have studied the following causes.

Referring to FIG. 1, the zero-order beam $L_0$ and the ± first-order beams $L_{+1}$ and $L_{-1}$ reflected on the optical disc 6 are traveled through the objective lens 5 and then reflected on the reflecting surface 4a of the beam splitter 4. Also they are traveled through the beam splitter 4 and introduced into the diffraction grating 3 which produces the corresponding zero-order beam $L_0$ and ± first-order beams $L_{+1}$ and $L_{-1}$, separately. Then, they are traveled through the collimator lens 2 and are introduced into the semiconductor laser apparatus 1. The beam amount of the laser beam to be incident on the semiconductor laser apparatus 1 is large when the non-polarizing beam splitter is used and small when the polarizing beam splitter is used. In this case, in accordance with the position of the relative rotation angle between the laser beam emission end face 1A of the semiconductor laser apparatus 1 and the diffraction grating 3, there are cases that a central beam La and side beams Lb and Lc at the both sides of the central beam La to be incident on the semiconductor laser apparatus 1 are respectively arranged such that as shown in FIG. 3, the central beam La is positioned in the active layer 1d on the end face 1A and the both side beams Lb and Lc are positioned in the up and down direction on the straight line passing through the central beam La and perpendicular to the active layer 1d, that the central beam La and the both side beams Lb and Lc are all positioned in the horizontal direction positioned on the active layer 1b and that the straight line formed by connecting the central beam La and the both side beams Lb and Lc is positioned at a desired angle position which is intermediate between the above-described two cases. The central beam La and Lc are provided by diffracting again the zero-order beam $L_0$ and ± first-order beams $L_{+1}$ and $L_{-1}$ by the diffraction grating 3 and superposing them in a mixed state.

When at least one of the both side beams Lb and Lc is made incident on the plane of the header portion 8, the plane of the header portion 8 is formed rough so that the beam is reflected irregularly. On the other hand, when at least one of the both side beams Lb and Lc is made incident on the laser beam emission end face 1A of the semiconductor laser apparatus 1, the end face 1A is excellent in reflectivity (for example, 10%) so that the beam is reflected on this end face 1A. As described above, the zero-order beam and the ± first-order beams incident on the semiconductor laser apparatus 1 are reflected thereon, diffracted again by the diffraction grating 3 and reached to the optical disc 6 so that on the photodetector 7, there is formed a complicated interference pattern.

The interference pattern is varied by a difference (phase difference) between the lengths of optical paths of the zero-order beam and the ± first-order beams. Thus, the interference pattern is varied by the change of the skew angle of the optical disc 6. Accordingly, the tracking error signal is varied by the change of the skew angle 60° of the optical disc 6 so as to have a periodicity as, for example, shown in FIG. 4. In practice, as $|\alpha|$ is increased, the level of the tracking error signal Se is attenuated. When the both side beams Lb and Lc are both made incident on the laser beam emission end face 1A, the amplitude of the waveform corresponding to FIG. 4 becomes twice the amplitude shown in FIG. 4 and the phase thereof becomes different from the phase of FIG. 4.

Next, the analysis of the above-described interference pattern will be made with reference to FIG. 5 (from which the lens system is omitted).

Referring to FIG. 5, 1A shown by a solid line designates the laser beam emission end face which is, however, is inclined relative to the laser beam emission end face 1A positioned at the normal position shown by a broken line. Further, reference numeral 6 shown by a solid line designates an optical disc. This optical disc 6 has a skew and hence is inclined relative to the normal position shown by a broken line. The zero-order beam $L_0$ is perpendicular to the laser beam emission end face 1A at the normal position and the recording surface of the optical disc 6 at the normal position. $\theta$ designates an angle of the + first-order beam $L_{+1}$ relative to the zero-order beam $L_0$. $l_1$ designates an optical path length between the laser beam emission end face 1A and the diffraction grating 3. $l_2$ designates an optical path length between the diffraction grating 3 and the recording surface of the optical disc 6. $\Delta l_1$ and $\Delta l_2$ respectively designate optical path length differences between the optical path length $l_1$ and $l_2$ of the zero-order beam $L_0$ and + first-order beam $L_{+1}$. $\Delta l_3$ and $\Delta l_4$ respectively designate an optical path difference caused by the skew of the optical disc 6 and an optical path difference caused by the skew of the laser beam emission end face 1A.

Further, g is taken as a phase difference between the zero-order beam $L_0$ and + first-order beam $L_{+1}$ in the diffraction grating 3. $i_0$ and $i_1$ are respectively taken as transmittances of the zero-order beam $L_0$ and the + first-order beam $L_{+1}$ in the diffraction grating 3. Reference letter t is taken as the transmittance of the half mirror 4 and r and f are respectively taken as reflectivities on the recording surface of the optical recording medium 6 and on the laser beam emission end face 1A.

Then, a complex amplitude of light at a point A on the recording surface of the optical disc 6 at which the + first-order beam $L_{+1}$ is incident will be considered separately with respect to the following four cases.

(1) $a_1$ : + first-order beam $L_{+1}$ is made incident at the point A, directly.

(2) $a_2$ : zero-order beam which results from reflecting the zero-order beam $L_0$ on the optical disc 6 and introducing it again into the diffraction grating 3 is reflected on the laser beam emission end face 1A and again introduced into the deffraction grating 3 to thereby produce the +first-order beam $L_{+1}$. This + first-order beam $L_{+1}$ is then incident at the point A.

(3) $a_3$ : + first-order beam is provided by reflecting the zero-order beam $L_0$ on the optical disc 6 and introducing it again into the deffraction grating 3. This + first-order beam is reflected on the laser beam emission end face 1A and incident again on the diffraction grating 3 to thereby produce the zero-order beam. This zero-order beam is then made incident at the point A.

(4) $a_4$ : zero-order beam is provided by reflecting the + first-order beam $L_{+1}$ on the optical disc 6 and introducing it again into the diffraction grating 3. This zero-order beam is reflected on the laser beam emission end face 1A and introduced again into the diffraction grating 3 to thereby produce the zero-order beam. Then, this zero-order beam is made incident at the point A.

The above-described $a_1$ to $a_4$ will be expressed by the following equations.

$$a_1 = i_1 t \cdot exp\{j(l_1 + g + l_2 + \Delta l_2 + \Delta l_3)\} \quad (1)$$

$$a_2 = i_0^2 i_1 t^3 rf \cdot exp[j\{3(l_1 + l_2) + g + \Delta l_2 + \Delta l_3\}] \quad (2)$$

$$a_3 = i_0^2 i_1 t^3 rf \cdot exp$$
$$[j\{3(l_1+l_2)+g+2\Delta l_1+\Delta l_2+\Delta l_3+2\Delta l_4\}] \quad (3)$$

$$a_4 = i_0^2 i_1 t^3 rf \cdot exp$$
$$[j\{3(l_1+l_2)+g+3(\Delta l_2+\Delta l_3)+2\Delta l_1+2\Delta l_4\}] \quad (4)$$

In order to simplify the calculations, if the length by which the laser beam can be interferenced is selected to be lower than 2 $(l_1+l_2)$, the intensity $I_A$ of light at the point A is expressed by the following equation (5).

$$\begin{aligned}I_A &= |a_1|^2 + |a_2 + a_3 + a_4|^2 \\ &= i_1^2 t^2 [1 + i_0^4 t^4 r^2 f^2 \{3 + 2\cos 2 (\Delta l_1 + \Delta l_4) + \\ &\quad 2\cos 2 (\Delta l_1 + \Delta l_4 + \Delta l_2 + \Delta l_3) + \\ &\quad 2\cos 2 (\Delta l_2 + \Delta l_3)\}]\end{aligned} \quad (5)$$

Further, when the both side beams Lb and Lc are both made incident of the laser beam emission end face 1A, if the + first-order beam $L_{+1}$ is made incident at the point A on the recording surface of the optical disc 6 and the − first-order beam $L_{-1}$ becomes incident on a point B which is symmetrical with respect to the zero-order beam $L_0$, the intensity $I_A$ of the light at the point A is given as by Eq. (5), while an intensity $I_B$ of light at the point B is expressed by the following equation (6).

$$I_B = i_1^2 t^2 [1 + i_0^4 t^4 r^2 f^2 \{3 + 2\cos 2 (\Delta l_1 - \quad (6)$$
$$\Delta l_4) + 2\cos 2 (\Delta l_1 - \Delta l_4 +$$
$$\Delta l_2 - \Delta l_3) + 2\cos 2 (\Delta l_2 - \Delta l_3)\}]$$

As described above, the complex interference pattern is produced on the photo-detector 7. Particularly, when relative to the central beam La, the both sides beams Lb and Lc are arranged in the vertical direction and the side beam Lb becomes incident on the laser beam emission end face 1A and the side beam Lc becomes incident on the header portion 8, respectively, the side beam Lb is reflected on the laser beam emission end face 1A and the side beam Lc is reflected irregularly on the header portion 8 (whose surface is formed rough) so that with respect to the both side beams Lb and Lc which are returned to the semiconductor laser apparatus 1 and then incident on the side of the disc 6 again there is caused an unbalance, thus the D.C. fluctuation being produced in the tracking error signal. Similarly the D.C. fluctuation is produced in the tracking error signals of the three spots method and the push-pull method as mentioned before.

OBJECTS AND SUMMARY OF THE INVENTION

Accordingly, it is an object of this invention to provide a tracking error detecting apparatus in which a tracking error signal indicative of an error of a zero-order beam from an optical head to the track of an optical recording medium can be prevented from being affected by the inclination of the optical recording medium in the track direction, or the variation of the tangential skew angle thereof.

It is another object of this invention to provide a tracking error detecting apparatus which is suitable for use with an optical recording apparatus, an optical reproducing apparatus, an optical recording and/or reproducing apparatus and so on.

According to one aspect of the present invention, there is provided a tracking error detecting apparatus for an optical head comprising a semiconductor laser apparatus, a diffraction grating, a beam splitter, an objective lens and a photo-detector, in which a laser beam from said semiconductor laser apparatus is divided into a main beam and two side beams at both sides of said main beam by said diffraction grating, said three beams are introduced through said beam splitter and said objective lens to an optical recording medium, beams reflected on said optical recording medium are introduced through said objective lens to said beam splitter and reflected thereon, said reflected beams are made incident on said photo-detector and detected outputs of at least two beams of said three beams from said photo-detector are used to produce a tracking error signal corresponding to the tracking state of said main beam on said optical recording medium, said tracking error detecting apparatus for an optical head being characterized in that the reflection of said side beam of said reflected beams on said optical recording medium which passes through said objective lens, said beam splitter and said diffraction grating and returns to said semiconductor laser apparatus is suppressed at a laser beam emission end face to thereby reduce influence by the skew of the optical disc on the tracking error signal.

These and other objects, features and advantages of the present invention will become apparent from the following detailed description of the preferred embodiments taken in conjunction with the accompanying drawings, throughout which like reference numerals designate like elements and parts.

DESCRIPTION OF THE PREFERRED EMBODIMENTS

Figure 6:
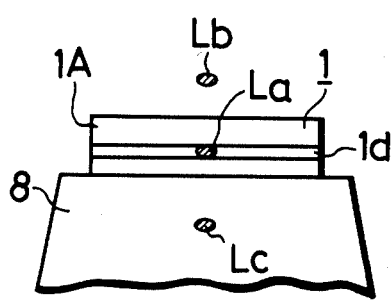
FIGS. 6–7, 8A–8B, 9A–9B and 10–15 are respectively diagrams showing embodiments of a tracking error detecting apparatus according to the present invention.

Referring initially to FIG. 6, an embodiment of a tracking error detecting apparatus according to the present invention will hereinafter be described in detail, in which case the laser beam emission end face 1A of the semiconductor laser apparatus or element 1 is high in reflectivity (for example, 10%). In FIG. 6, like parts corresponding to those of FIGS. 1 to 5 are marked with the same references and will not be described.

FIG. 6 shows a case in which the straight line formed by connecting the central beam La and the both side beams Lb and Lc each of which is to be incident on the semiconductor laser element 1 is made substantially perpendicular to the active layer 1d of the semiconductor laser element 1. By the way, in this embodiment, the thickness (height) of the semiconductor laser element 1 is selected to be as thin (low) as about 80 μm so that of the both side beams Lb and Lc, the side beam Lb, which is shown on the upper side of FIG. 6, can be prevented from being made incident on the laser beam emission end face 1A. In FIG. 6, the beam Lc at the lower side becomes incident on the heat sink 8, on which it is irregularly reflected. Other arrangements are similar to those of FIGS. 1 to 5.

In consequence, according to the optical tracking error detecting apparatus with the laser semiconductor apparatus of this invention, even if the beams reflected on the optical recording medium are traveled through the objective lens 5, the beam splitter 4 and the diffraction grating 3 and then introduced to the semiconductor laser element 1, there is no fear that the beams will be reflected on the laser beam emission end face 1A. Thus it is possible to obtain a tracking error signal of the zero-order beam from the optical head OH relative to the optical recording medium which can be prevented from being varied due to the variation of the tangential skew angle of the optical recording medium.

Figure 7:
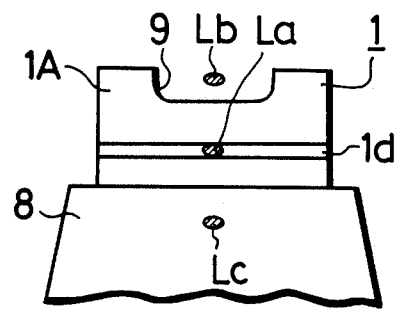

If there arises a problem of strength of the semiconductor laser element 1 when it is reduced in thickness, as shown in FIG. 7, a groove 9 is formed from the upper surface of the semiconductor laser element 1 at its central portion so that the upper laser beam Lb can be prevented from being made incident on the laser beam emission end face 1A.

If there is a possibility that the both side beams Lb and Lc will become incident on the active layer 1d on the laser beam emission end face 1A, the width of the semiconductor laser element 1 is reduced or the grooves are formed at both sides of the semiconductor laser element 1 in order to avoid such possibility.

Figure 8A:
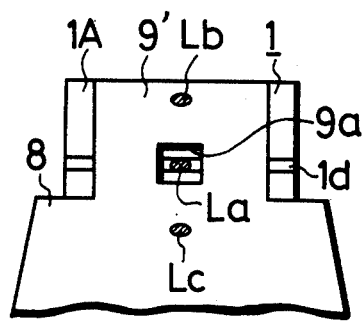
Figure 8B:
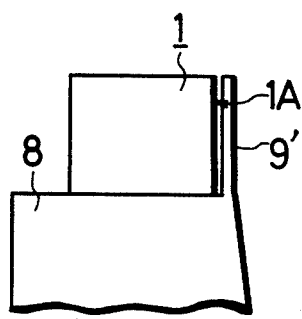

Referring to FIG. 8, a second embodiment of the optical tracking error detecting apparatus according to the present invention will be described, in which case, the laser beam emission end face 1A of the semiconductor laser element 1 is high in reflectivity (for example, 10%). In FIG. 8, like parts corresponding to those of FIGS. 6 and 7 are marked with the same references and will not be described.

In this embodiment, as shown in FIG. 8, a part of the heat sink 8 is extended to form a light shield plate (member) 9' so as to oppose the laser beam emission end face 1A of the semiconductor laser element 1 with a predetermined spacing therebetween through which a window 9a is formed at its portion corresponding to the laser beam emitting portion of the active layer or region 1d whereby to secure the emission of the laser beam L.

Then, according to the tracking error detecting apparatus of such optical head, even if the laser beams reflected on the optical recording medium are traveled through the objective lens 5, the beam splitter 4 and the diffraction grating 3 and then incident on the semiconductor laser element 1, such laser beams are reflected irregularly by the light shield plate 9' so that it is possible to obtain a tracking error signal which can be prevented from being varied due to the change of the zero-order beam from the optical head OH by the tangential skew angle of the optical recording medium.

Figure 9A:
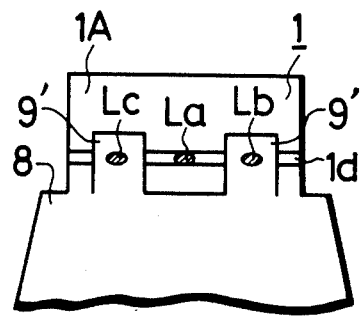
Figure 9B:
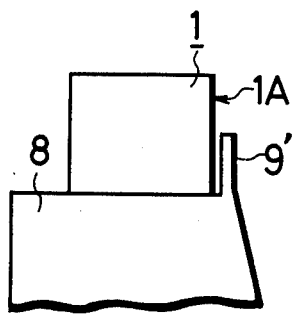

If there is a possiblity that the both side beams Lb and Lc will become incident on the laser beam emission end face 1A, as shown in FIG. 9, a part of the heat sink 8 is extended at two places to form a pair of light shield plates 9' and 9' which are opposed to the laser beam emission end face 1A of the semiconductor laser element 1 with a predetermind spacing therebetween. The pair of the light shield plates 9' and 9' are disposed at the positions to shield the both side beams Lb and Lc which are to be incident on the semiconductor laser element 1.

While it may be possible that the light shield plate 9' for absorbing or shielding the light can be bonded to the laser beam emission end face 1A of the semiconductor laser element 1 by bonding and the like, in this case an insulating material is used in this case.

Figure 10:
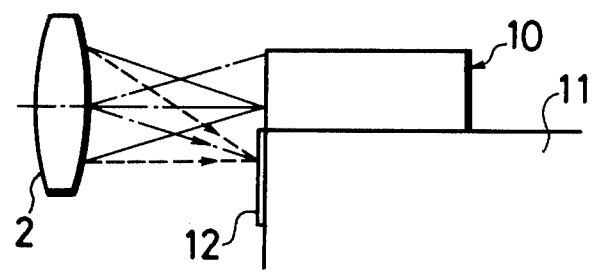
Figure 11:
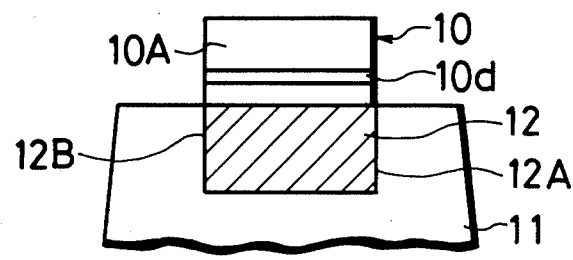

FIGS. 10 and 11 are each a diagram showing a third embodiment of the tracking error detecting apparatus according to the present invention. This third embodiment is further improved such that as shown in the first or second embodiment, the upper beam Lb can be prevented from being made incident on the laser beam emission end face or the laser beam emission end face of the semiconductor laser is low in reflectivity (for example, about 2 to 3%), or a laser diode of high output is used. In FIGS. 10 and 11, reference numeral 10 designates a laser diode chip and 11 a header portion made of metal, 10A a laser beam emission end face and 10d an active layer, respectively.

In this embodiment, the surface of the header portion 11 at which the side beams traveled through the collimator lens 2 along the optical paths shown by broken lines are incident is coated with a non-reflecting coating material 12. Accordingly, even if the side beam is made incident on the header portion 11 at its portion coated with the non-reflecting coating material 12, the reflection thereof can be suppressed so that the side beam can be prevented substantially from becoming incident on the collimator lens 2 once again.

In this case, it is not necessary to coat the non-reflecting coating material 12 on the whole area of the header portion 11 at its surface opposing to the collimator lens 2 in the lateral direction but it is possible to coat it on only its portion under the laser diode chip 10 on which the laser beam is made incident.

Further, the positions of end sides 12A and 12B in the right and left directions of the portion coated with the non-reflecting coating material 12 in FIG. 11 can be used as markers for matching the positions of the laser diode chip 10 and the header portion 11 when the laser diode chip is mounted on the header portion. In other words, if the distance between the both end sides 12A and 12B is selected to be equal to the width of the laser beam emission end face 10A of the laser diode chip 10, the positions can be matched by only matching the both side ends of the laser diode chip 10 with the both end sides 12A and 12B of the non-reflecting coating material-coated portion 12. It is needless to say that the both end sides 12A and 12B are both not used as the markers but it is sufficient that one of them is used as the marker for matching the positions.

Figure 12:
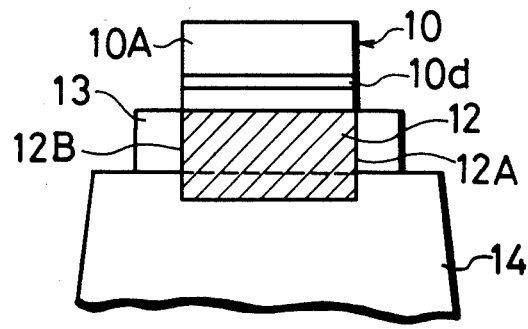

The semiconductor laser apparatus 1 is not limited to such structure that the laser diode chip 10 is directly mounted on the heat sink made of metal but may be such one as shown in FIG. 12 in which the laser diode chip 10 is mounted on a silicone substrate 13 and then this silicone substrate 13 on which the laser diode chip 10 is mounted is mounted on a heat sink 14. In other words, in this case, the header portion is formed of the silicone substrate 13 and the heat sink 14.

In the case of the semiconductor laser apparatus with such structure, there is a case that the side beam will become incident not on the heat sink 14 but on the silicone substrate 13.

Therefore, in the case of the example of the semiconductor laser apparatus shown in FIG. 12, the non-reflecting coating material 12 is coated on the necessary portions of the silicone substrate 13 and the heat sink 14.

Figure 13:
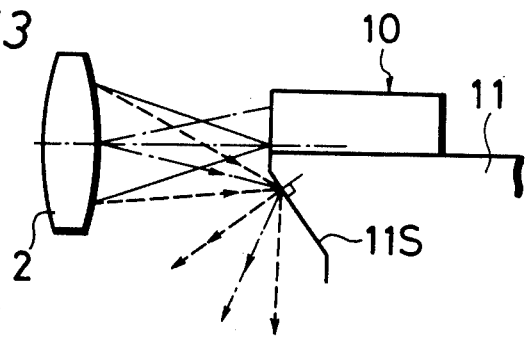

FIG. 13 is a diagram showing other embodiment of the optical tracking error detecting apparatus according to this invention, in which another embodiment of the semiconductor laser apparatus is used. As shown in FIG. 13, reference numeral 10 designates a laser diode chip and 11 a header portion made of metal.

In this embodiment, as shown in FIG. 13, the plane of the header portion 11 on which the side beams, which are passed through the collimator lens 2 along the optical paths shown by a broken lines, are incident is inclined as shown in the figure at 11S so that the reflected side beams thereon can be prevented from becoming incident on the collimator lens 2 once again.

In this case, if the surface of the inclined portion 11S is not formed as a rough surface but as a mirror surface so as to avoid the irregular reflection, there can be achieved a significant effect.

Figure 14:
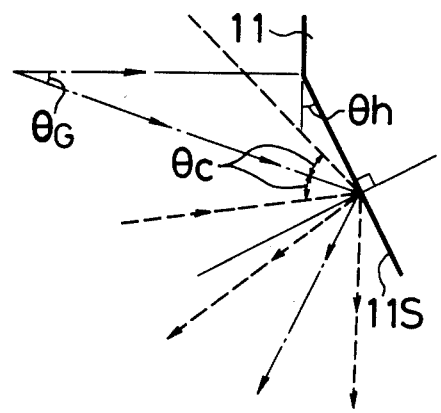

Further, as shown in FIG. 14, if $\theta_G$ is taken as an angle between the main beam and the side beam, an N.A. (numerical aperture) of the collimator lens 2 is taken as NAc and the condition of $\theta_c = \sin^{-1} NA_c$ and an angle $\theta_h$ between the inclined portion 11S and the plane perpendicular to the main beam is selected to satisfy the following condition $$\theta_h + \theta_G - \theta_c > 0$$

the reflected light of the side beam from the header portion 11 can be prevented from being made incident on the collimator lens 2.

Figure 15:
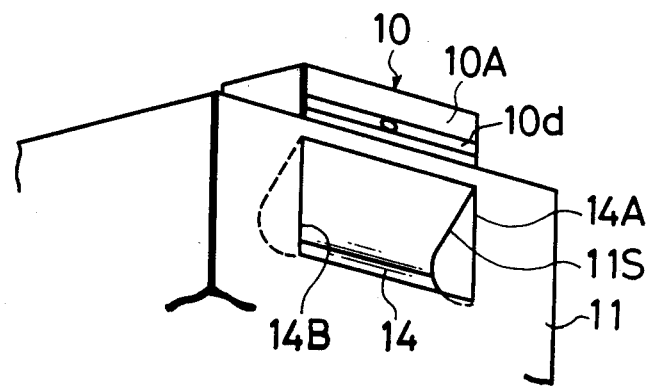

In this case, it is not necessary to provide the inclined portion 11S on the whole area of the header portion 11 at its surface opposing to the collimator lens 2 in the lateral direction. It is, however, sufficient that as shown in FIG. 15, on the header portion 11, a concave portion 14 having the inclined portion 11S is provided only at the incident portion of the side beam under the laser diode chip 10. In this case, both sides 14A and 14B of this concave portion 14 can be used as markers for matching the positions in the lateral direction when the laser diode chip 10 is mounted on the header portion 11. In other words, if the distance between the both sides 14A and 14B is selected to be equal to the width of the end face 10A of the laser diode chip 10, the matching of the positions therebetween can be carried out only by matching the both sides of the laser diode chip 10 with the both side edges 14A and 14B of the concave portion 14. Of course, it is possible that the both side edges 14A and 14B are used as the markers but either of them is used as the marker for matching the positions.

The inclined portion 11S may not be formed rectilinearly but be formed as a curved surface.

According to these embodiments of the invention as set forth above, since of the side beams the reflected beam of the beam incident on the header portion can be prevented from being returned to the optical system again, if it is arranged to suppress the reflected beam at the side of the laser beam emission end face of the laser diode chip, it is possible to remove the D.C. fluctuation from being produced in the tracking error signal by the skew of the optical disc more effectively.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. In a tracking error detecting device for an optical reproducing apparatus in which an optical head reads a signal recorded on an optical recording medium, said device comprising semiconductor laser means having a header portion and an end face from which a laser beam is emitted, diffraction grating means for dividing said laser beam into a main beam and two beams at opposite sides, respectively, of said main beam, beam splitter means receiving the three beams from said diffraction grating means to transmit the same therethrough, objective lens means receiving the three transmitted beams for focusing the same onto said recording medium, photodetector means and tracking error signal generating means, said three beams being reflected back from said recording medium to return through said objective lens means to said beam splitter means, the three returned beams being reflected in part by said beam splitter means to be incident on said photodetector means, said photodetector means producing detected outputs in response to the beams incident thereon and said tracking error signal generating means providing a tracking error signal in response to said detected outputs, the returned side beams also being transmitted in part through said beam splitter means and said diffraction grating means to said laser means along respective paths whose lengths, measured from said recording medium, vary with skewing of said recording medium; characterized in that said header portion includes an inclined portion and in that one of said returned side beams is returned to said end face at a position such as to avoid the reflection of said one returned side beam from said end face, and the other of said returned side beams is incident on said inclined portion so as to be prevented from being reflected therefrom to be incident again on said photodetector means.

* * * * *

UNITED STATES PATENT AND TRADEMARK OFFICE
CERTIFICATE OF CORRECTION

PATENT NO. : 4,742,506

DATED : May 3, 1988

INVENTOR(S) : Atsushi Fukumoto et al.

It is certified that error appears in the above-identified patent and that said Letters Patent is hereby corrected as shown below:

COLUMN 1 AND 2 MISSING FROM PATENT

In the abstract, line 18, change "tacking" to --tracking--;

Column 3, line 56, change "$60°$" to --$\alpha°$--.

Signed and Sealed this

Thirteenth Day of March, 1990

Attest:

JEFFREY M. SAMUELS

Attesting Officer

Acting Commissioner of Patents and Trademarks

TRACKING ERROR DETECTING APPARATUS FOR AN OPTICAL HEAD WITH SKEW ERROR REDUCTION BY USING AN INCLINED HEADER PORTION

BACKGROUND OF THE INVENTION

1. Field of the Invention

This invention relates generally to tracking error detecting apparatus for an optical head and more particularly, is directed to a tracking error detecting apparatus for an optical head for use with an optical recording apparatus, an optical reproducing apparatus, an optical recording and/or reproducing apparatus.

2. Description of the Prior Art

Figure 1:
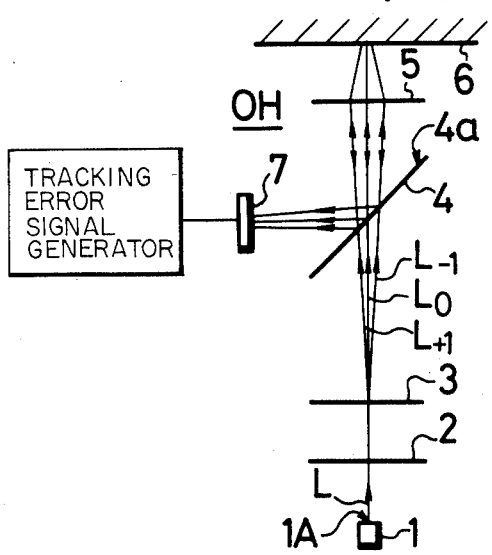
FIG. 1 is a diagram showing a construction of an optical system of a prior art optical head.

FIG. 1 is a diagram showing an example of a prior art tracking error detecting apparatus for an optical head, in which reference letter OH generally designates an optical head on the whole. In FIG. 1, reference numeral 1 designates a semiconductor laser apparatus using a laser diode. In this semiconductor laser apparatus 1, a divergent laser beam L of ellipse-shape in cross section oscillated out or emitted from a laser light emission end face 1A thereof is made incident on a collimator lens 2 (which may be omitted as required) in which it is collimated as a parallel beam. This parallel beam is then made incident on a diffraction grating 3. From the diffraction grating 3 there are produced a zero-order beam $L_0$ and $\pm$ first-order beams $L_{+1}$ and $L_{-1}$ (beams higher than + second-order or lower than − second-order are neglected). These beams are traveled through a non-polarizing beam splitter (half mirror) 4 (if a polarizing beam splitter is used, a ¼ wavelength plate is provided between it and an objective lens 5) and is then made incident on the objective lens 5 thereby converged. The converged zero-order beam $L_0$ and $\pm$ first-order beams $L_{+1}$ and $L_{-1}$ are made incident on a recording surface of an optical disc 6 used as an optical recording medium (including a magnetooptical recording medium) with a predetermined spacing (for example, 10 μm) therebetween.

The zero-order beam $L_0$ and $\pm$ first-order beams $L_{+1}$ and $L_{-1}$ reflected by the optical recording disc 6 are traveled through the objective lens 5 and introduced into the beam splitter 4, while a part of them is reflected on a reflecting surface 4a of the beam splitter 4 and thereby made incident on a photo-detector 7. The photo-detector 7 is formed of three photo-detecting sections to permit the zero-order beam $L_0$ and $\pm$ first-order beams $L_{+1}$ and $L_{-1}$ to become incident thereon separately.

In the case of a tracking error detecting method known as a so-called three spots method, by calculating a difference between a pair of photo-detected outputs from a pair of photo-detecting sections on which the $\pm$ first-order beams $L_{+1}$ and $L_{-1}$ are incident, it is possible to obtain a tracking error signal which is corresponding to the tracking state of the zero-order beam $L_0$ on the recording surface of the optical disc 6. From the photo-detecting section on which the zero-order beam $L_0$ is made incident, there are produced a reproduced signal, a focusing error signal and so on.

Further, there is a method (see Japanese patent application No. 215860/1984) which is the improvement of a tracking error signal detecting method based on a so-called push-pull method. In this known method, of the three beams, zero-order beam and one of the side beams provided at the both sides of the zero-order beam or all of three beams are used.

More specifically, this method uses such a photo-detector for the three beams the photo-detecting section of which is divided into equal two sections. Further, it is arranged such that when the beam spot by the zero-order beam lies on the track of the optical disc, the beam spots by the side beams provided at both sides of the zero-order beam lie on the lands or they are formed with a displacement of ½ track pitch. Accordingly, the outputs based on the difference between the detected outputs from the respective photo-detecting sections of the photo-detector relative to the beam spots, or the push-pull outputs become opposite in phase with respect to the beam spots formed by the zero-order beam and $\pm$ first-order beams. Whereas, the D.C. fluctuation components produced in the push-pull outputs by the lateral displacement of the objective lens and the skew of the disc become same in phase.

Accordingly, if a difference between the push-pull output $PP_0$ from the photo-detector relative to the zero-order beam and the push-pull output $PP_1$ or $PP_2$ from the photo-detector for + first-order beam or − first-order beam is calculated, regardless of the lateral displacement of the objective lens and the skew of the optical disc, it is possible to obtain a tracking error signal which has no D.C. fluctuation components.

Using three push-pull outputs, $PP_0$, $PP_1$ and $PP_2$, it is also possible to obtain the tracking error signal by caluculating $PP_0-(G_1 PP_1+G_2 PP_2)$. In this case, $G_1$ and $G_2$ represent constants which are presented by considering a difference between the gains of the photo-detectors.

Next, an example of the semiconductor laser apparatus 1 will be described with reference to FIG. 2.

Figure 2:
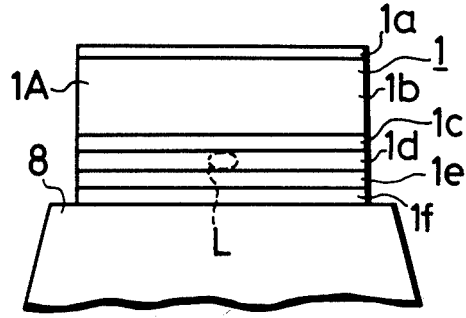
FIG. 2 is a front view of a prior art semiconductor laser apparatus.
Figure 3:
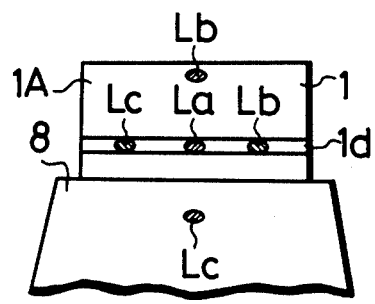
FIG. 3 is a diagram useful for explaining returned beams of the prior art semiconductor laser apparatus.
Figure 5:
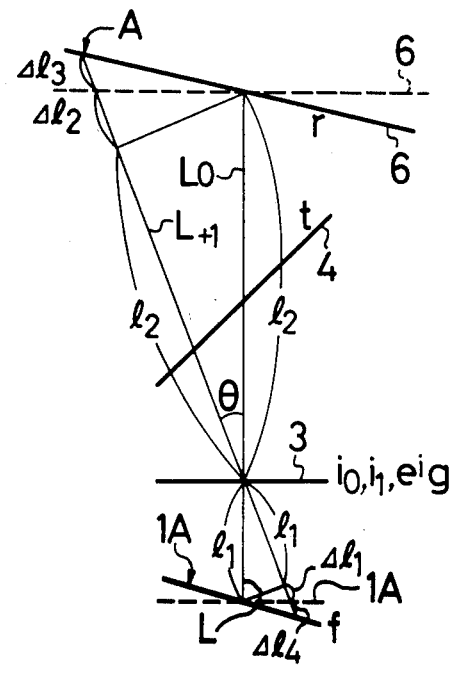
FIG. 5 is a diagram useful for explaining an occurrence of the interference.
Figure 4:
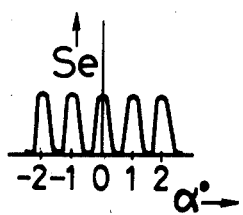
FIG. 4 is a characteristic graph of interference.

Referring to FIG. 2, this semiconductor laser apparatus 1 is generally fixed to a header portion 8 made of metal such as copper and so on serving as one electrode which becomes a heat sink. In other words, in this example, the header portion 8 is formed of only the heat sink.

The structure of the laser chip of the semiconductor laser apparatus 1 will be described in the order of the upper layer to the lower layer. Reference numeral 1a designates an electrode layer, 1b an n-GaAs layer (substrate layer), 1c an n-Ga$_{1-y}$Al$_y$As layer (cladding layer), 1d a Ga$_{1-x}$Al$_x$As layer (cladding layer) and 1f a p-GaAs layer. The above laser beam L is oscillated out from the active layer 1d. If the laser beam emission end face (wall surface) 1A of this semiconductor laser apparatus 1 is taken as a front, the width thereof is in a range from 100 to 300 μm, the height (thickness) thereof is in a range from 80 to 100 μm and the depth thereof is in a range from 200 to 300 μm, respectively. The height of the active layer 1d from the upper surface of the header portion 8 is several μm.

By the way, in practice, when the tracking error detecting method of not only the three spots method but also improved push-pull system is used, if in the optical disc, there is the skew in the tangential direction thereof, a D.C. fluctuation is produced in the tracking error signal so that it is not possible to detect the tracking error precisely.

After various researches, the present inventors et al. have studied the following causes.

Referring to FIG. 1, the zero-order beam $L_0$ and the $\pm$ first-order beams $L_{+1}$ and $L_{-1}$ reflected on the opti-